(12) United States Patent
Mizuseki et al.

(10) Patent No.: US 9,184,557 B2
(45) Date of Patent: Nov. 10, 2015

(54) OPTICAL MODULE AND METHOD OF CONTROLLING OPTICAL MODULE

(71) Applicant: OCLARO JAPAN, INC., Kanagawa (JP)

(72) Inventors: Sachiko Mizuseki, Kanagawa (JP); Yusuke Nishida, Tokyo (JP); Genki Yasuda, Tokyo (JP)

(73) Assignee: OCLARO JAPAN, INC., Kanagawa (JP)

( * ) Notice: Subject to any disclaimer, the term of this patent is extended or adjusted under 35 U.S.C. 154(b) by 0 days.

(21) Appl. No.: 14/027,506

(22) Filed: Sep. 16, 2013

(65) Prior Publication Data

US 2014/0079083 A1     Mar. 20, 2014

(30) Foreign Application Priority Data

Sep. 19, 2012  (JP) ................................. 2012-205729
Jul. 19, 2013  (JP) ................................. 2013-150265

(51) Int. Cl.
*H01S 3/04*  (2006.01)
*H01S 5/024*  (2006.01)
*H01S 5/068*  (2006.01)
*H01S 5/06*  (2006.01)

(52) U.S. Cl.
CPC .......... *H01S 5/02415* (2013.01); *H01S 5/06804* (2013.01); *H01S 5/02453* (2013.01); *H01S 5/0617* (2013.01)

(58) Field of Classification Search
CPC . G02B 6/4266; H01S 5/0085; H01S 5/02248; H01S 5/02438; H01S 5/02453
USPC ...................................................... 372/34, 36
See application file for complete search history.

(56) References Cited

U.S. PATENT DOCUMENTS

| | | | | |
|---|---|---|---|---|
| 7,609,732 | B2 * | 10/2009 | Ishibashi | 372/34 |
| 2004/0202210 | A1 * | 10/2004 | Thornton | 372/34 |
| 2008/0273561 | A1 * | 11/2008 | Fu et al. | 372/34 |
| 2013/0044777 | A1 * | 2/2013 | Amari | 372/34 |

FOREIGN PATENT DOCUMENTS

JP        2010-239056 A      10/2010

\* cited by examiner

*Primary Examiner* — Tuan Nguyen
(74) *Attorney, Agent, or Firm* — Mattingly & Malur, PC

(57) ABSTRACT

Provided is an optical module in which a temperature of a semiconductor element to be subjected to temperature control is controlled to fall within a desired operating temperature range regardless of whether an environmental temperature is outside or inside the operating temperature range of the semiconductor element, and which is stably operated with low power consumption. A control section 30 determines, based on the environmental temperature having a temperature range of from a first temperature to a second temperature, a target temperature from a predetermined operating temperature range of from a third temperature to a fourth temperature. The control unit 30, an ATC circuit 34, a TEC control IC 12, and a TEC 24 control the temperature of a laser module 20 to become the target temperature. The first temperature is lower than the third temperature, and the second temperature is higher than the fourth temperature.

14 Claims, 4 Drawing Sheets

OPTICAL MODULE AND METHOD OF CONTROLLING OPTICAL MODULE

CROSS-REFERENCE TO RELATED APPLICATIONS

The present application claims priority from Japanese applications JP 2012-205729 filed on Sep. 19, 2012 and JP 2013-150265 filed on Jul. 19, 2013, the content of which is hereby incorporated by reference into this application.

BACKGROUND OF THE INVENTION

1. Field of the Invention

The present invention relates to an optical module and a method of controlling an optical module.

2. Description of the Related Art

There is known an optical module including a laser module in which a semiconductor laser and an electro-absorption modulator (EAM) element that operates as an optical modulator are integrated. As one example of such an EA element included in the optical module, there is known a cooled EA element that is used while being controlled to have a constant operating temperature regardless of the temperature in the vicinity of the EA element (environmental temperature). The operating temperature of the cooled EA element is relatively high. Therefore, when the environmental temperature decreases, it is necessary to heat the cooled EA element by a thermo-electric cooler (TEC), which requires a large amount of power.

Further, as another example of the EA element included in the optical module, there is known an uncooled EA element. As an example of a technology relating to the uncooled EA element, Japanese Patent Application Laid-open No. 2010-239056 discloses an uncooled-type distributed feedback laser integrated with an electro-absorption modulator that is capable of performing long-distance transmission at high speed. The range of the operating temperature of the uncooled EA element is wide to some extent. Therefore, it is known that, when the uncooled EA element is used as the EA element included in the optical module, as compared to the case where the cooled EA element is used, the optical module can be operated with low power consumption.

SUMMARY OF THE INVENTION

It is required that the optical module be operated in a wide environmental temperature range of, for example, −40° C. or more and 85° C. or less. When the cooled EA element is used as a light source of the optical module, the maximum value of the temperature difference between the operation temperature of the cooled EA element (constant) and the environmental temperature becomes extremely large. Therefore, there arises a problem in that power consumption required for cooling or heating the cooled EA element is extremely large. When the uncooled EA element is used as the light source in this case, the uncooled EA element can operate in a temperature range wider than the case of the cooled EA element. However, the operable temperature range thereof is about, for example, 0° C. or more and 70° C. or less, which is narrower than the required environmental temperature range. Therefore, cooling or heating is necessary even outside the operable temperature range of the uncooled EA element.

Prior to the present invention, the inventors and the like have considered such a control that, in the optical module using the uncooled EA element, the uncooled EA element is cooled or heated only when the temperature thereof exceeds the operable temperature range. With such a control method, the uncooled EA element is not subjected to temperature control in the operable temperature range of the uncooled EA element, and hence the power consumption can be lowered. However, in a case where the temperature control is started when the temperature of the uncooled EA element exceeds the operable temperature range thereof, the fluctuation amount of the current flowing to the TEC that performs the temperature control increases, which has caused unstable operation of the optical module. As described above, conventionally, low power consumption and stable operation of the optical module have been unable to be realized simultaneously.

The present invention has been made in view of the above-mentioned problem, and realizes an optical module in which the temperature of a semiconductor element to be subjected to temperature control is controlled to fall within a desired operating temperature range regardless of whether an environmental temperature is outside or inside the operating temperature range of the semiconductor element, and which is stably operated with low power consumption.

(1) In order to solve the above-mentioned problem, according to one embodiment of the present invention, there is provided an optical module, including: a temperature sensor for detecting an environmental temperature having a temperature range of from a first temperature to a second temperature; a semiconductor element to be subjected to temperature control; a target temperature determining unit that determines, based on a temperature detected by the temperature sensor, a target temperature from an operating temperature range that is a predetermined temperature range of from a third temperature to a fourth temperature; and a temperature controlling unit that controls a temperature of the semiconductor element to become the target temperature, in which the first temperature is lower than the third temperature, and in which the second temperature is higher than the fourth temperature.

(2) In the optical module as described in the above-mentioned item (1), the target temperature determining unit may determine the target temperature in a manner that the target temperature is increased as the detected environmental temperature becomes higher.

(3) In the optical module as described in the above-mentioned item (2), the temperature controlling unit may control the temperature of the semiconductor element over a period in which the optical module is operated, without stopping an operation thereof.

(4) In the optical module as described in the above-mentioned item (1), the target temperature determining unit may determine the target temperature based on a function y=f(x) representing a relationship between an environmental temperature x and a target temperature y, the function representing monotonic increase of the target temperature y with respect to increase of the environmental temperature x.

(5) In the optical module as described in the above-mentioned item (4), the function y=f(x) may be any one of an odd-degree polynomial function and a trigonometric function in which an inflection point exists within a range of the environmental temperature x from the first temperature to the second temperature.

(6) In the optical module as described in the above-mentioned item (2), the target temperature determining unit may determine the target temperature based on a function y=f(x) representing a relationship between an environmental temperature x and a target temperature y, the function representing monotonic decrease of the target temperature y with respect to increase of the environmental temperature x in a range of at least a part of a range of a range of the environmental temperature x from the first temperature to the second temperature.

(7) In the optical module as described in the above-mentioned item (1), the semiconductor element may be an electro-absorption modulator.

(8) According to one embodiment of the present invention, there is provided a method of controlling an optical module, the optical module including: a temperature sensor for detecting an environmental temperature having a temperature range of from a first temperature to a second temperature; and a semiconductor element to be subjected to temperature control; the method of controlling the optical module including: determining, based on a temperature detected by the temperature sensor, a target temperature from an operating temperature range that is a predetermined temperature range of from a third temperature to a fourth temperature; and controlling a temperature of the semiconductor element to become the target temperature, in which the first temperature is lower than the third temperature, and in which the second temperature is higher than the fourth temperature.

The present invention realizes the optical module in which the temperature of the semiconductor element to be subjected to the temperature control is controlled to fall within the desired operating temperature range regardless of whether the environmental temperature is outside or inside the operating temperature range of the semiconductor element, and which is stably operated with low power consumption.

DETAILED DESCRIPTION OF THE INVENTION

Now, an embodiment of the present invention is described in detail with reference to the drawings.

Figure 1:
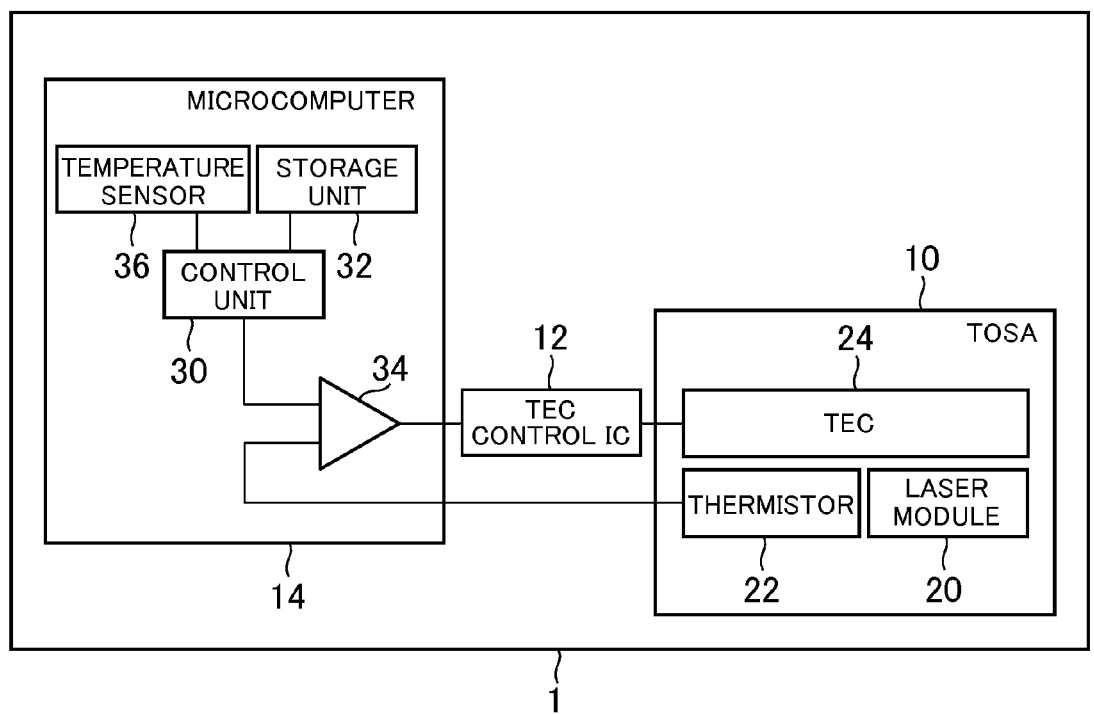
FIG. 1 is a diagram schematically illustrating an example of a configuration of an optical transmitter according to an embodiment of the present invention.

FIG. 1 is a diagram schematically illustrating an example of a configuration of an optical transmitter 1 that is an example of an optical module according to the embodiment of the present invention. As illustrated in FIG. 1, the optical transmitter 1 according to this embodiment includes, for example, an optical communication section (in this embodiment, for example, transmitter optical sub-assembly (TOSA) 10), a TEC control IC 12, and a microcomputer 14.

The TOSA 10 includes, for example, a laser module 20, a thermistor 22, and a TEC 24. The laser module 20 is, for example, a device in which a distributed feedback (DFB) semiconductor laser and an uncooled EA element are integrated.

The microcomputer 14 according to this embodiment includes, for example, a control unit 30 (for example, a CPU) and a storage unit 32 (for example, a memory). The microcomputer 14 according to this embodiment further includes, for example, an automatic temperature control (ATC) circuit 34 and a temperature sensor 36 therein.

The thermistor 22 according to this embodiment monitors the temperature of the laser module 20 (hereinafter referred to as "LM temperature"), and outputs a signal voltage corresponding to the LM temperature to the ATC circuit 34. The TEC 24 according to this embodiment cools or heats the laser module 20 to change the LM temperature.

The temperature sensor 36 according to this embodiment detects the temperature in the vicinity thereof (environmental temperature), and outputs a signal representing the detected temperature to the control unit 30.

Figure 2:
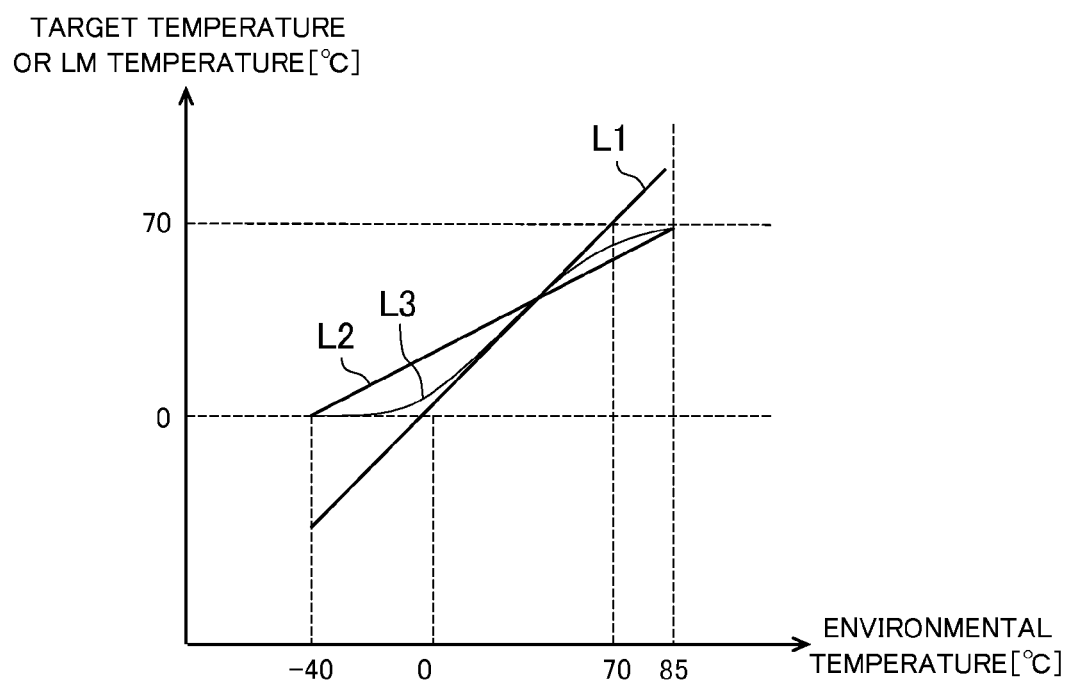
FIG. 2 is a graph showing an example of a relationship between an environmental temperature and a target temperature or an LM temperature.
Figure 3:
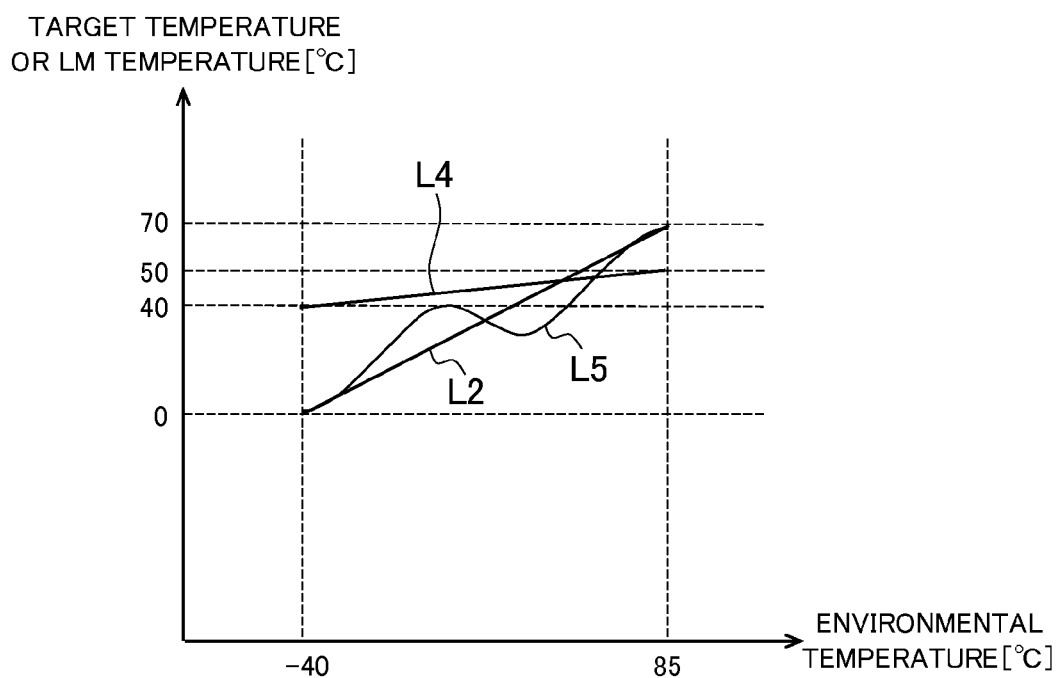
FIG. 3 is a graph showing another example of a relationship between the environmental temperature and the target temperature or the LM temperature.

The storage unit 32 according to this embodiment stores, for example, target temperature setting data representing a relationship between the environmental temperature and a target temperature that is a control target temperature for the laser module 20. FIG. 2 is a graph showing an example of the relationship between the environmental temperature and the target temperature or the LM temperature. FIG. 3 is a graph showing another example of the relationship between the environmental temperature and the target temperature or the LM temperature. The target temperature setting data is implemented as, for example, a table in which the value of the environmental temperature and the value of the target temperature are associated with each other, or data representing a mathematical expression for calculating the value of the target temperature based on the value of the environmental temperature.

Further, the storage unit 32 according to this embodiment stores, for example, output voltage determining data representing a relationship between the target temperature and a signal voltage to be output. The output voltage determining data is implemented as, for example, a table in which the value of the target temperature and the value of the signal voltage to be output are associated with each other, or data representing a mathematical expression for calculating the value of the signal voltage to be output based on the value of the target temperature.

The control unit 30 according to this embodiment determines the target temperature based on the temperature that is represented by the signal input from the temperature sensor 36 and target temperature setting data stored in the storage unit 32. Then, the control unit 30 determines the signal voltage to be output based on the determined target temperature and the output voltage determining data stored in the storage unit 32. Then, the control unit 30 outputs the determined signal voltage to the ATC circuit 34.

The ATC circuit 34 according to this embodiment outputs a signal voltage corresponding to a difference between the signal voltage output from the control unit 30 and the signal voltage output from the thermistor 22 (for example, a signal voltage obtained by subtracting the signal voltage output from the thermistor 22 from the signal voltage output from the control unit 30) to the TEC control IC 12.

The TEC control IC 12 according to this embodiment performs control so that a TEC current in an amount corresponding to the signal voltage output from the ATC circuit 34 flows through the TEC 24. As described above, the current flowing between the TEC control IC 12 and the TEC 24 is controlled. With this power control, the TEC 24 is heated or cooled, and the LM temperature is controlled so as to approach the target temperature.

In this embodiment, the relationship between the temperature and the signal voltage output from the control unit 30 or the thermistor 22 is preset in a one-on-one association in, for example, the output voltage determining data or the like. Therefore, the signal voltage output from the ATC circuit 34 is associated with the temperature difference between the target temperature and the LM temperature. Further, in this embodiment, the TEC control IC 12 performs control so that TEC currents in opposite directions flow through the TEC 24 depending on whether the value of the signal voltage output from the ATC circuit 34 is positive or negative. Then, in this embodiment, the TEC control IC 12 performs control to cool the TEC 24 when the LM temperature is higher than the target temperature, and heat the TEC 24 when the LM temperature is lower than the target temperature.

In this embodiment, for example, the control unit 30 plays a role as a target temperature determining unit that determines, based on the temperature detected by the temperature sensor 36, the target temperature from a predetermined operating temperature range. Further, in this embodiment, for example, the control unit 30, the ATC circuit 34, the TEC control IC 12, and the TEC 24 play a role as a temperature controlling unit that controls the temperature of a semiconductor element, such as the laser module 20, to become the target temperature.

As described above, in this embodiment, the LM temperature can be controlled to fall within the operating temperature range of the laser module 20 regardless of whether the environmental temperature is outside or inside the operating temperature range.

Further, in this embodiment, the control unit 30 controls the LM temperature over a period in which the optical transmitter 1 is operated, without stopping its operation.

For example, when the laser module 20 is subjected to temperature control by the TEC 24 by causing the TEC current to flow through the TEC 24 only in a case where the LM temperature exceeds the operating temperature range, at the time of drive of the TEC 24, the thermal resistance between the TEC 24 and the laser module 20 changes sharply. Therefore, the fluctuation amount of the current flowing between the TEC control IC 12 and the TEC 24 increases, which causes unstable operation of the optical transmitter 1. In this embodiment, the control unit 30 controls the LM temperature over a period in which the optical transmitter 1 is operated, without stopping its operation, and hence as compared to other cases, the optical transmitter 1 can be operated stably.

In this embodiment, the laser module 20 having the uncooled EA element mounted thereon is an object to be subjected to temperature control. Then, in this embodiment, the TEC 24 performs heating or cooling to control the LM temperature. In this embodiment, it is assumed that a temperature range in which the laser module 20 can be driven (operating temperature range) is 0° C. or more and 70° C. or less.

A line L1 of FIG. 2 represents a relationship between the environmental temperature and the LM temperature under a state in which the temperature control is not performed in this embodiment. The line L1 has a relationship of y=ax+b (where y represents an LM temperature, x represents an environmental temperature, and a and b represent predetermined constants). In this case, in order to set the LM temperature to be 0° C. or more and 70° C. or less, the environmental temperature is required to be 0° C. or more and 70° C. or less. In view of this, by setting the target temperature setting data so as to be data representing the relationship of y=(axa')x+(b+b') (where y represents a target temperature, x represents an environmental temperature, a and b represent predetermined constants, and a' and b' represent setting parameters) as represented by a line L2 of FIG. 2, the range of the environmental temperature in which the target temperature becomes 0° C. or more and 70° C. or less is widened to −40° C. or more and 85° C. or less. As described above, in this embodiment, when the temperature as the lower limit of the environmental temperature is set to a first temperature, the temperature as the upper limit thereof is set to a second temperature, the temperature as the lower limit of the target temperature is set to a third temperature, and the temperature as the upper limit thereof is set to a fourth temperature, the first temperature (for example, −40° C.) is lower than the third temperature (for example, 0° C.), and the second temperature (for example, 85° C.) is higher than the fourth temperature (for example, 70° C.).

Further, even when the target temperature setting data is set so as to be data representing, as represented by a line L3 of FIG. 2, a cubic function of y=cx^3+dx^2+ex+f (where y represents a target temperature, x represents an environmental temperature, and c, d, e, and f represent setting parameters) in which the gradient of the line in a low temperature range and a high temperature range is small, and the gradient of the line in other temperature ranges becomes close to a, the range of the environmental temperature in which the target temperature becomes 0° C. or more and 70° C. or less is widened to −40° C. or more and 85° C. or less. Further, a function y=f(x) representing the relationship between an environmental temperature x and a target temperature y is not limited to a linear function or a cubic function. For example, such a function that the range of the environmental temperature x in which the difference between the gradient of the function y=f(x) and the gradient a of the above-mentioned line L1 falls within a predetermined range becomes as wide as possible may be employed as the function y=f(x). For example, an odd-degree polynomial function (for example, a quintic function or a seventh degree function) or a trigonometric function in which the inflection point exists within the range of the environmental temperature x of −40° C. or more and 85° C. or less may be employed as the function y=f(x) representing the relationship between the environmental temperature x and the target temperature y.

By appropriately setting the relationship between the environmental temperature and the target temperature in the target temperature setting data, it is possible to respond to various specifications required for the optical transmitter 1. For example, in case of a line L2 of FIG. 3 (which is the same line as the line L2 of FIG. 2) and a line L5 of FIG. 3, the range of the target temperature when the range of the environmental temperature is set to −40° C. or more and 85° C. or less becomes 0° C. or more and 70° C. or less. On the other hand, in a line L4 of FIG. 3, the range of the target temperature when the range of the environmental temperature is set to −40° C. or more and 85° C. or less becomes 40° C. or more and 50° C. or less. For example, when importance is placed on reduction in power consumption, it is preferred that the target temperature setting data be set so that the range of the target temperature that is associated with the range of the environmental temperature is relatively widened (for example, so that the relationship between the environmental temperature and the target temperature becomes data that is represented by the line L2 of FIG. 3). On the other hand, when importance is placed on optical specifications such as power and extinction ratio characteristics, it is preferred that the target temperature setting data be set so that the range of the target temperature that is associated with the range of the environmental temperature is relatively narrowed (for example, so that the relationship between the environmental temperature and the target temperature becomes data that is represented by the line L4 of FIG. 3). Further, the target temperature setting data may be set so as to not only monotonically increase within a target temperature range associated with a certain environmental temperature range, but also monotonically decrease in a range of at least a part of the target temperature range associated with a certain environmental temperature range (for example, so that the relationship between the environmental temperature and the target temperature becomes data that is represented by the line L5 of FIG. 3). Depending on the dependence of the optical characteristics of the EA element on temperature, in some cases, better characteristics can be obtained when such control as one described above is performed. When further importance is placed on optical characteristics, control for monotonic decrease may be performed.

Figure 4:
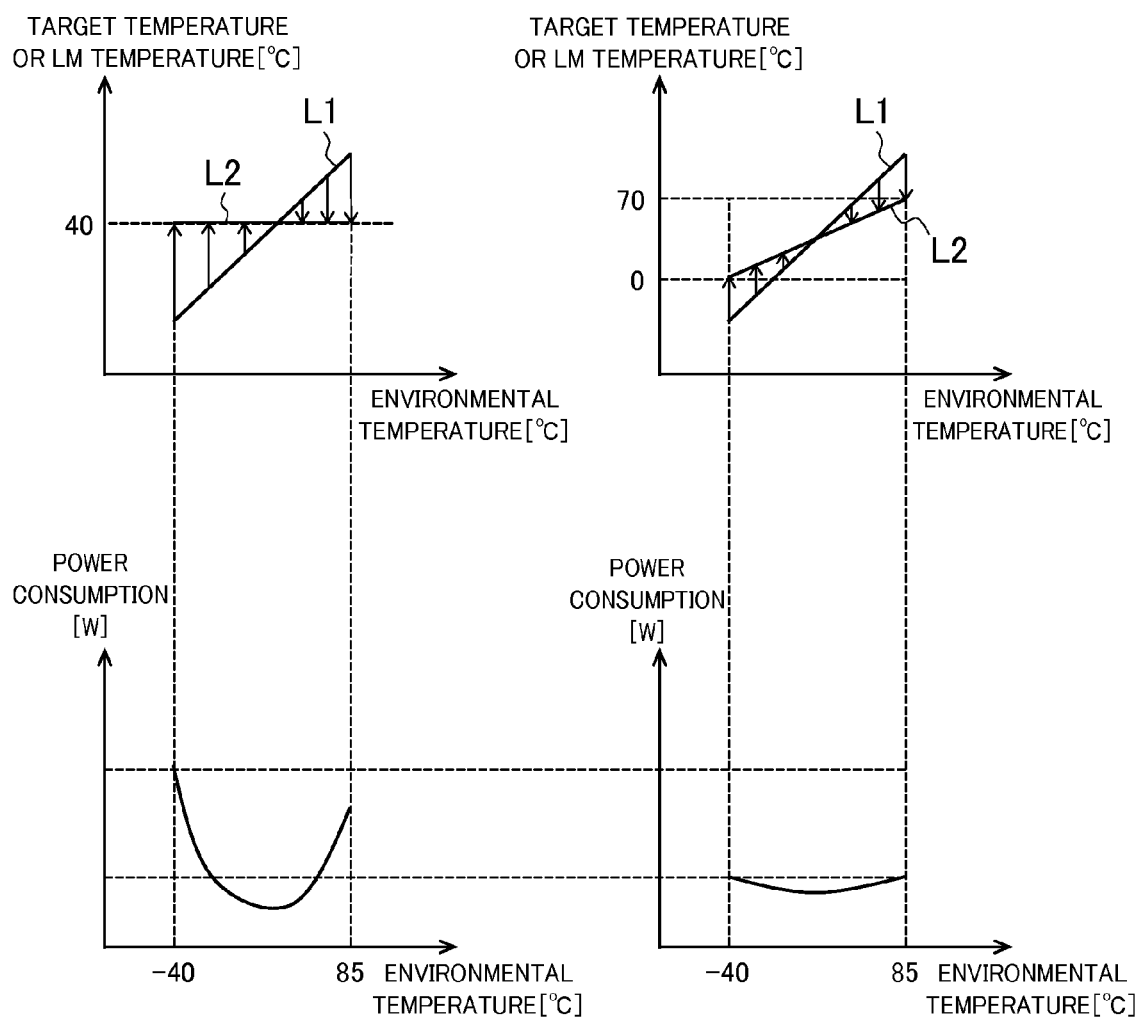
FIG. 4 is an explanatory graph showing an example of an effect of reduction in power consumption in the optical transmitter according to the embodiment of the present invention.

FIG. 4 is an explanatory graph showing an example of an effect of reduction in power consumption in the optical transmitter 1 according to this embodiment. An upper left part of FIG. 4 shows an example of a correspondence relationship between the environmental temperature and the target temperature or the LM temperature when temperature control is performed so that the target temperature is constant (for example, 40° C.) regardless of the environmental temperature. Further, in the upper left part of FIG. 4, the relationship between the environmental temperature and the LM temperature under a state in which the temperature control is not performed is represented by a line L1, and the relationship between the environmental temperature and the target temperature under a state in which the temperature control is performed is represented by a line L2. A lower left part of FIG. 4 shows an example of a correspondence relationship between the environmental temperature and the power consumption when temperature control is performed so that the target temperature is constant (for example, 40° C.) regardless of the environmental temperature.

An upper right part of FIG. 4 shows an example of a correspondence relationship between the environmental temperature and the target temperature or the LM temperature when the control according to this embodiment is performed. Further, in the upper right part of FIG. 4, the relationship between the environmental temperature and the LM temperature under a state in which the temperature control is not performed is represented by a line L1, and the relationship between the environmental temperature and the target temperature under a state in which the temperature control is performed is represented by a line L2. A lower right part of FIG. 4 shows an example of a correspondence relationship between the environmental temperature and the power consumption when the control according to this embodiment is performed.

When the temperature control is performed so that the target temperature is constant (for example, 40° C.) regardless of the environmental temperature, in a case where the environmental temperature is significantly different from the target temperature, the TEC 24 requires large power for heating or cooling. In this embodiment, based on the temperature detected by the temperature sensor 36, the target temperature is determined from the predetermined operating temperature range, and the LM temperature is controlled to become the determined target temperature. Further, in this embodiment, the target temperature is determined in a manner that the target temperature is increased as the temperature detected by the temperature sensor 36 becomes higher. As described above, in this embodiment, the power consumption of the optical transmitter 1 can be reduced.

Now, description is made of numerical examples of the effect of reduction in power consumption in a case where the control according to this embodiment is performed as compared to the case where the temperature control is performed so that the target temperature is constant regardless of the environmental temperature. For example, it is assumed that the relationship between the environmental temperature and the LM temperature is (LM temperature) [° C.]=0.56×(environmental temperature)+22.4 [° C.]. Further, it is assumed that the range of the environmental temperature required for a small form-factor pluggable plus (SFP+) is −40° C. or more and 85° C. or less. In this case, when the target temperature is controlled so as to be constant at 40° C. regardless of the environmental temperature, the power consumption of the optical transmitter 1 is the maximum when the environmental temperature is −40° C. In this case, by performing the control according to this embodiment, the maximum power consumption of the optical transmitter 1 reduces to 63%. Further, also when the target temperature is controlled so as to be constant at 60° C. regardless of the environmental temperature, the power consumption of the optical transmitter 1 is the maximum when the environmental temperature is −40° C. In this case, by performing the control according to this embodiment, the maximum power consumption of the optical transmitter 1 reduces to 56%. As described above, according to this embodiment, the power consumption of the optical transmitter 1 can be drastically reduced.

Note that, the present invention is not limited to the above-mentioned embodiment. The power consumption as the optical module is the maximum when the temperature difference between the environmental temperature and the target temperature is the maximum. Therefore, when a target temperature with respect to a certain environmental temperature is determined, the maximum value of the power consumption as the optical module is determined. In many cases, the temperature difference between the environmental temperature and the target temperature is the maximum in a case where the environmental temperature is the minimum or the maximum, and hence the power consumption is the maximum when the environmental temperature is the minimum or the maximum. Therefore, for example, when the temperature difference between the environmental temperature and the target temperature is the maximum when the environmental temperature has the minimum value, the function connecting the minimum value and the maximum value of the target temperature does not affect the maximum power consumption even if the minimum value and the maximum value is connected in any function as long as the whole range of the function falls within the maximum temperature difference described above. The same is true even when the environmental temperature is the maximum, and also even if the temperature difference between the environmental temperature and the target temperature is the maximum when the environmental temperature is neither the minimum nor the maximum. Therefore, the function connecting the minimum value and the maximum value of the target temperature is not limited to the above-mentioned odd-degree function, and may be an even-degree function or a log function. Note that, as described above, the temperature difference between the environmental temperature and the target temperature is often the maximum when the environmental temperature is the minimum or the maximum. In such a case, in order to reduce the average power consumption in actual use instead of the maximum power consumption, the function as L3 described above is suitable.

For example, the difference between the temperature detected by the temperature sensor 36 and the actual temperature of the laser module 20 may be measured in advance, and the signal voltage corrected in accordance with the measured temperature difference may be output from the control unit 30 to the ATC circuit 34. Further, the ATC circuit 34 may be arranged outside the microcomputer 14. Further, the temperature sensor 36 may be arranged outside the microcomputer 14. Further, for example, the functions realized by the microcomputer 14, the ATC circuit 34, and the TEC control IC 12 in this embodiment may be realized by hardware, software, or a combination of hardware and software. For example, the functions realized by the microcomputer 14, the ATC circuit 34, and the TEC control IC 12 may be realized by executing a program installed in the microcomputer 14 by the control unit 30.

Further, the application range of the present invention is not limited to the laser module 20 or the uncooled EA element included in the laser module 20. This embodiment may be applied to, other than the laser module 20 and the uncooled EA element included in the laser module 20, for example, a semiconductor element to be subjected to temperature control, which has a predetermined operating temperature range (for example, a directly modulated DFB laser element). Further, this embodiment may be applied to a semiconductor element included in an optical receiver.

While there have been described what are at present considered to be certain embodiments of the invention, it will be understood that various modifications may be made thereto, and it is intended that the appended claims coverall such modifications as fall within the true spirit and scope of the invention.

What is claimed is:

1. An optical module, comprising:
   an optical communication section having a semiconductor element to be subjected to temperature control disposed inside of the optical communication section;
   a first temperature sensor to detect an environmental temperature having a range from a first temperature to a second temperature and disposed outside of the optical communication section;
   a second temperature sensor to monitor a temperature of the semiconductor element;
   a target temperature determining unit that determines, based on the environmental temperature detected by the first temperature sensor, a target temperature which is in a predetermined operating temperature range from a third temperature to a fourth temperature; and
   a temperature controlling unit that controls the temperature of the semiconductor element to become the target temperature based on the determined target temperature and the temperature of the semiconductor element monitored by the second temperature sensor,
   wherein the first temperature is lower than the third temperature, and
   wherein the second temperature is higher than the fourth temperature.

2. The optical module according to claim 1, wherein the target temperature determining unit determines the target temperature in a manner that the target temperature is increased as the detected environmental temperature increases.

3. The optical module according to claim 2, wherein the temperature controlling unit controls the temperature of the semiconductor element over a period in which the optical module is operated, without stopping an operation thereof.

4. The optical module according to claim 2, wherein the target temperature determining unit determines the target temperature based on a function $y=f(x)$ representing a relationship between the environmental temperature x and the target temperature y, the function representing monotonic decreases of the target temperature y with respect to increases of the environmental temperature x in at least a part of the range of the environmental temperature x from the first temperature to the second temperature.

5. The optical module according to claim 1, wherein the target temperature determining unit determines the target temperature based on a function $y=f(x)$ representing a relationship between the environmental temperature x and the target temperature y, the function representing monotonic increases of the target temperature y with respect to increases of the environmental temperature x.

6. The optical module according to claim 5, wherein the function $y=f(x)$ comprises one of an odd-degree polynomial function and a trigonometric function in which an inflection point exists within a range of the environmental temperature x from the first temperature to the second temperature.

7. The optical module according to claim 1, wherein the semiconductor element comprises an electro-absorption modulator.

8. A method of controlling an optical module,
   the optical module including:
      an optical communication section having a semiconductor element to be subjected to temperature control disposed inside of the optical communication section; and
      a first temperature sensor to detect an environmental temperature having a range from a first temperature to a second temperature and disposed outside of the optical communication section; and
   a second temperature sensor for monitoring a temperature of the semiconductor element;
   the method of controlling the optical module comprising:
   determining, based on the environmental temperature detected by the first temperature sensor disposed outside of the optical communication section, a target temperature which is in a predetermined operating temperature range from a third temperature to a fourth temperature; and
   controlling the temperature of the semiconductor element to become the target temperature based on the determined target temperature and the temperature of the semiconductor element monitored by the second temperature sensor,
   wherein the first temperature is lower than the third temperature, and
   wherein the second temperature is higher than the fourth temperature.

9. The method according to claim 8, wherein the target temperature is determined to increase as the detected environmental temperature increases.

10. The method according to claim 9, wherein the target temperature is determined based on a function $y=f(x)$ representing a relationship between the environmental temperature x and the target temperature y, the function representing monotonic decreases of the target temperature y with respect to increases of the environmental temperature x in at least a part of the range of the environmental temperature x from the first temperature to the second temperature.

11. The method according to claim 8, wherein the temperature of the semiconductor element is controlled over a period in which the optical module is operated, without stopping an operation thereof.

12. The method according to claim 8, wherein the target temperature is determined based on a function $y=f(x)$ representing a relationship between the environmental temperature x and the target temperature y, the function representing monotonic increases of the target temperature y with respect to increases of the environmental temperature x.

13. The method according to claim 12, wherein the function $y=f(x)$ comprises one of an odd-degree polynomial function and a trigonometric function in which an inflection point exists within a range of the environmental temperature x from the first temperature to the second temperature.

14. The method according to claim 8, wherein the semiconductor element comprises an electro-absorption modulator.

\* \* \* \* \*